(12) United States Patent
Amberger et al.

(10) Patent No.: US 11,088,513 B2
(45) Date of Patent: Aug. 10, 2021

(54) LASER DIODE DEVICE

(71) Applicant: Robert Bosch GmbH, Stuttgart (DE)

(72) Inventors: Maximilian Amberger, Karlsruhe (DE); Gerald Brinks, Waltenhofen (DE); Tobias Zoller, Grossbettlingen (DE)

(73) Assignee: Robert Bosch GmbH, Stuttgart (DE)

( * ) Notice: Subject to any disclaimer, the term of this patent is extended or adjusted under 35 U.S.C. 154(b) by 35 days.

(21) Appl. No.: 16/680,639

(22) Filed: Nov. 12, 2019

(65) Prior Publication Data

US 2020/0153205 A1  May 14, 2020

(30) Foreign Application Priority Data

Nov. 14, 2018 (DE) .......................... 102018219421.1

(51) Int. Cl.
| | | |
|---|---|---|
| *H01S 5/40* | (2006.01) | |
| *H01S 5/024* | (2006.01) | |
| *H01S 5/02* | (2006.01) | |
| *H01S 5/0236* | (2021.01) | |

(52) U.S. Cl.
CPC .......... *H01S 5/4025* (2013.01); *H01S 5/0216* (2013.01); *H01S 5/0236* (2021.01); *H01S 5/02469* (2013.01)

(58) Field of Classification Search
CPC .. H01S 5/4025; H01S 5/02469; H01S 5/0216; H01S 5/0236; H01S 5/0206; H01S 5/021; H01S 5/0213; H01S 5/0215; H01S 5/022; H01S 5/02208; H01S 5/0234; H01S 5/024
See application file for complete search history.

(56) References Cited

U.S. PATENT DOCUMENTS 6,710,926 B2 * 3/2004 Beach .................... G02B 3/005
359/619

* cited by examiner

*Primary Examiner* — Tuan N Nguyen
(74) *Attorney, Agent, or Firm* — Norton Rose Fulbright US LLP; Gerard Messina

(57) ABSTRACT

A laser diode device includes a thermally conductive substrate that has a planar surface for dissipating ambient heat, and a plurality of laser diodes situated thereon, each of which includes at least one epitaxial layer that is situated on a side of the laser diode facing the substrate. The laser diodes are each electrically activated via an electrically conductive coating situated between the at least one epitaxial layer and the substrate. The substrate includes a plurality of metallized cavities that accommodate the plurality of laser diodes so that the plurality of laser diodes have an essentially uniform height above the substrate.

18 Claims, 2 Drawing Sheets

LASER DIODE DEVICE

CROSS-REFERENCE TO RELATED APPLICATIONS

The present application claims priority under 35 U.S.C. § 119 to DE 10 2018 219 421.1 filed in the Federal Republic of Germany on Nov. 14, 2018, the content of which is hereby incorporated by reference herein in its entirety.

FIELD OF THE INVENTION

The present invention relates to a laser diode device encompassing a thermally conductive substrate including a planar surface for dissipating ambient heat, and a plurality of laser diodes situated thereon, each of which encompasses at least one epitaxial layer, the at least one epitaxial layer being situated on a side of the laser diode facing the substrate, and the laser diodes each being electrically activated via an electrically conductive coating situated between the at least one epitaxial layer and the substrate.

BACKGROUND

A laser diode can encompass multiple, preferably between one and five, epitaxial layers.

It is also known from the related art that it is necessary, in part, to operate multiple semiconductor chips in parallel in order to increase the emitted optical power of a laser diode device. If individual laser diodes are utilized for this purpose, they can be precisely adjusted with respect to one another only under certain conditions, and the dimensions of the laser diodes themselves are also subjected to tolerances. The offset of the individual laser diodes results in imaging errors in the laser diode device and, therefore, in the optical system into which it is integrated (for example, a LIDAR system). Therefore, a poorer system performance also ultimately results.

Moreover, the laser diodes are to be placed close to one another in order to obtain the desired optical beam properties. All this causes the lasers themselves to heat up to a great extent during operation and then drop out of a predefined temperature specification.

Typically, individual laser diodes are cooled from underneath due to the connection to a thermally conductive substrate (for example, a ceramic). Laser bars (laser diodes connected to each other) are also possibly cooled from above using clamps. This is not possible in the case of many individually activated laser diodes, however, since the laser diodes typically must be electrically contacted on the top side and the underside and, using the clamp, only a continuously conductive clamp structure can be utilized.

In a discrete configuration of individual laser diodes, wire bonds are typically utilized for the electrical contacting. These do not allow for a significant cooling of the component, however, due to the small cross section.

SUMMARY

According to the present invention, a laser device includes a substrate that has a plurality of metallized cavities that accommodate a plurality of laser diodes, so that the plurality of laser diodes have an essentially uniform height above the substrate.

This has advantages such as the following. The laser diodes are placed on the thermally conductive substrate on the basis of an established spacing in a highly spatially precise manner. By placing the laser diodes having at least one epitaxial layer (active layer) in the direction of this substrate, the heat can be quickly dissipated by the thermally conductive substrate, on the one hand. This permits a high heat dissipation directly on the at least one epitaxial layer of the laser diodes, which considerably improves the entire dissipation of the heat. This thermally conductive substrate can be a highly thermally conductive substrate. Within the scope of the present invention, a highly thermally conductive substrate is a substrate having a thermal conductivity of 1 W/mK through 200 W/mK.

On the other hand, the position of the laser diodes perpendicularly to the surface of the substrate can be very precisely defined. For this purpose, the at least one epitaxial layer is produced highly precisely with respect to its thickness. Due to the planar build-up technique having an essentially uniform height above the substrate, even the smallest signal paths are possible, in order to keep inductances in the laser circuit preferably low. The mounting of the laser diodes on a shared substrate also makes it possible to more easily achieve the necessary precision, since, due to the smaller size of the laser diode device, a possibly more expensive but precisely produced substrate, such as an AlN ceramic, can be more easily utilized. The planar surface can be a highly planar surface. Within the scope of the present invention, a highly planar surface of the substrate is a surface having the following properties: roughness <3 µm (Ra) and warpage of <5 µm along the long edge of the substrate (i.e., along the laser array).

The substrate can be a silicon substrate. The cavities are formed at the positions of the laser diodes. The cavities accommodate the laser diodes on the basis of a micromechanically precisely adjustable height tolerance and, in this way, result in an extremely flat build-up technique. Alternatively, the substrate can also be a ceramic, which includes two metallization planes.

Since all laser diodes are mounted on a shared substrate, the substrate can be tested separately. This increases the yield, since every single failure of a laser diode no longer results in a complete failure of the control circuit board. In the case in which reworkable contacting material (for example, solder, silver conductive adhesive) is utilized, the laser diode device can even be exchanged.

Finally, wire bonds can also be dispensed with in the design according to the present invention. This simplifies the process control on the shared substrate, since the wire bond-pad surfaces no longer need to be kept clean. As a result, for example, solder can be more easily utilized.

It is also advantageous in this case, that, between two laser diodes, an electrically conductive compensation structure is situated on the substrate, which preferably has the same height as the laser diodes.

In the manufacturing process of the laser diode device according to the present invention, after the laser diodes have been mounted on the substrate, electrically conductive compensation structures can be mounted on the substrate. These can be made up of either silicon, metal, semiconductors, or specific SMD components (capacitors, resistors) and preferably have the same height as the laser diodes.

It is preferred that the electrically conductive compensation structure is fastened on the substrate using solder or conductive adhesive. The compensation structures can also be mounted using solder or conductive adhesive, preferably, however, including slight height variations, so that height differences need not be compensated for.

Alternatively, it is advantageous in this case, that, between two laser diodes, a capacitive structure is situated on the substrate, which preferably has the same height as the laser diodes.

The compensation structures can, alternatively, be replaced by capacitive structures ("silicon capacitors") provided for the laser shot circuit, which can be vertically integrated using soldering/bonding. Just as is the case for the compensation structure, the height distribution of these components is to be observed.

In every case, it is advantageous that the plurality of laser diodes and the electrically conductive compensation structure or the plurality of laser diodes and the capacitive structure are fastened to a base substrate via their side facing away from the substrate.

The substrate including the plurality of laser diodes and the components (electrically conductive compensation structure, capacitive structure), which are additionally present, if necessary, can be integrated on the base substrate in a simple flip chip process. Due to the already fanned-out heat dissipation of the laser diodes, the base substrate can be made of a poorer thermally conductive material, since the necessary temperature distribution away from the laser diodes is already achieved using the highly thermally conductive substrate. For example, PCB, $Al_2O_3$, glass, or also AlN can be utilized as the base substrate. The closer the thermal expansion coefficients of the base substrate and of the substrate are set with respect to each other, the lesser the tendency is that the structure formed from the base substrate and the substrate will undergo a thermal deformation.

Finally, it is advantageous that the fastening using a thermally conductive bonding layer is designed in such a way that it compensates for height differences between the plurality of laser diodes, the electrically conductive compensation structure, or the capacitive structure.

The heights of the various utilized components (laser diodes, electrically conductive compensation structure, capacitive structure) are essentially matched to one another and are identically set. However, slight height differences cannot be entirely avoided, due to production tolerances. These height differences can be compensated for, however, in that the substrate is bonded "upside down" onto the base substrate. The increased thermal resistance of the thicker bonding is compensated for by the greatly increased heat dissipation via the highly thermally conductive substrate and the adjacent electrically conductive structures and capacitive structures. In addition, the compact design permits very small inductances in the laser circuits, in order to achieve preferably short pulse times and high efficiency.

Example embodiments of the present invention are described in greater detail with reference to the drawings and the following description.

DETAILED DESCRIPTION

Figure 1:
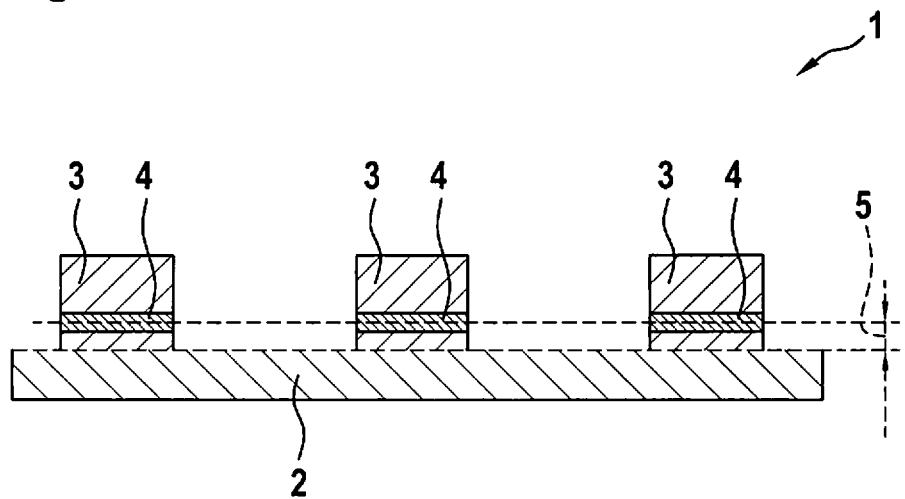
FIG. 1 shows a laser diode device including a plurality of laser diodes, according to an example embodiment of the present invention.

A laser diode device 1 is shown in FIG. 1. Laser diode device 1 encompasses a thermally conductive substrate 2 including a planar surface for dissipating ambient heat. Substrate 2 can be made, for example, of AlN, $Al_2O_3$, Si, or glass. Situated on substrate 2 are a plurality of laser diodes 3 (three laser diodes 3 are shown; however, more laser diodes 3, for example, up to twenty, can be provided). Each of the laser diodes 3 encompasses one or more (active) epitaxial layers 4. Epitaxial layer 4 is situated on a side of laser diode 3 facing substrate 2. Individual epitaxial layers 4 are placed, in a passive, highly precise, plane-parallel manner, at an essentially shared height 5 over flat substrate 2.

Due to the evenness of substrate 2 in combination with the low process fluctuations of epitaxial layer 4, a highly precise adjustment (for example, $<=1$ μm) of laser diodes 3 results perpendicularly to substrate 2 and also to the rotation axes in the plane of substrate 2. Due to a highly precise placement method, as well as a highly precise joining method (such as AuSn solder or also silver conductive paste), laser diodes 3 can be precisely placed in all six spatial axes (for example ~1 μm or 0.01 degree).

This laser diode device 1 can already then be tested with respect to the functionality of laser diodes 3, in order to prevent rejects of complete boards due to defective laser diodes 3.

Figure 2:
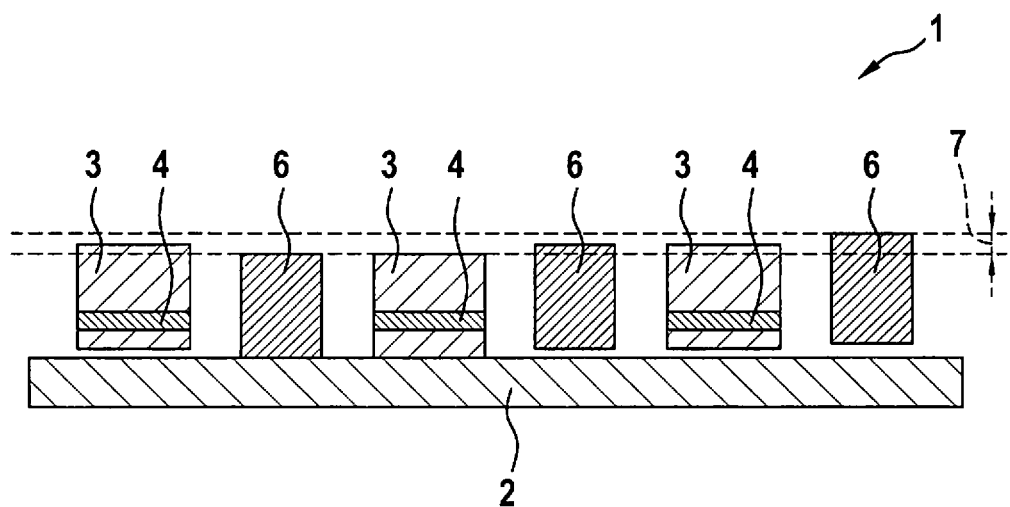
FIG. 2 shows the laser diode device including a plurality of electrically conductive structures, situated between the plurality of laser diodes, according to an example embodiment of the present invention.

Thereafter, as shown in FIG. 2, electrically conductive compensation structures 6 are mounted onto substrate 2. These can be made up of either silicon, metal, semiconductors, or specific SMD components (capacitors, resistors) and preferably have the same height as laser diodes 3. These compensation structures 6 can also be mounted onto substrate 2 using solder or conductive adhesive. Preferably, this takes place, however, with low height variations 7, due to thickness fluctuations and adhesive/solder variations, so that height differences do not need to be compensated.

Figure 3:
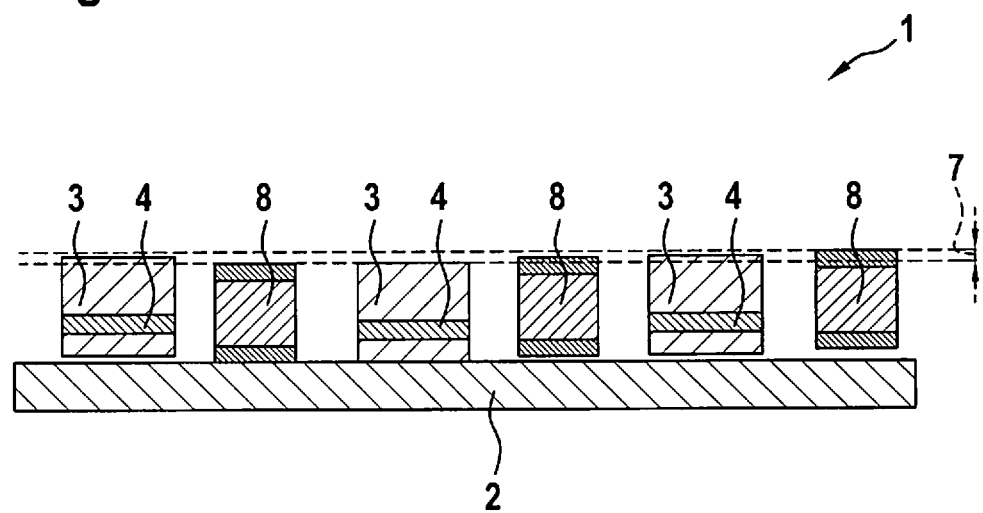
FIG. 3 shows the laser diode device including a plurality of capacitive structures, situated between the plurality of laser diodes, according to an example embodiment of the present invention.

Alternatively, it is shown in FIG. 3 that, instead of electrically conductive compensation structures 6, capacitive structures 8 can also be utilized, which are also situated between the plurality of laser diodes 3. Capacitive structures 8 are capacitors ("silicon capacitors") provided for the laser shot circuit, which can be vertically integrated using soldering/bonding. In this case as well, height variation 7, specifically, is to be observed.

Figure 4:
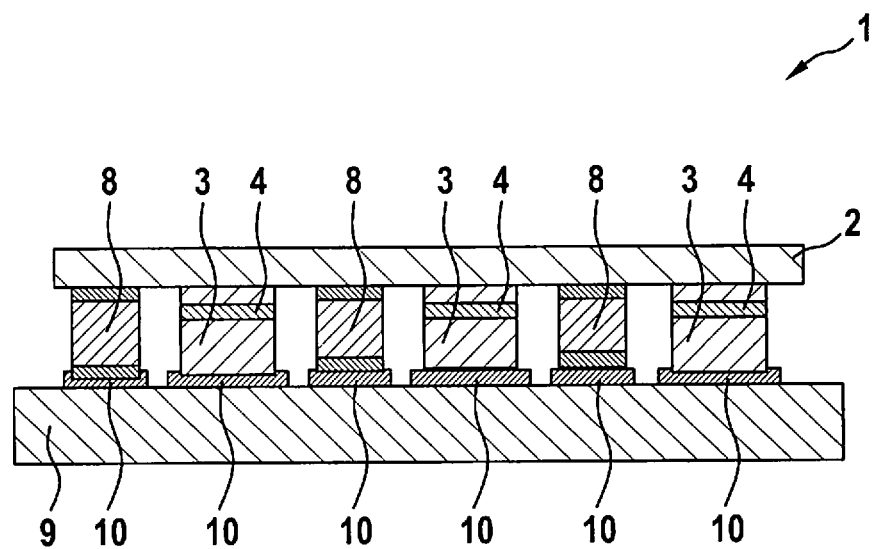
FIG. 4 shows the laser diode device including a base substrate, according to an example embodiment of the present invention.

Finally, it is shown in FIG. 4 that highly thermally conductive substrate 2, including the superstructures—laser diodes 3, electrically conductive compensation structure 6, capacitive structure 8—can be mounted on a base substrate 9. This can take place using a simple flip chip process.

In order to always be able to compensate for height variations present due to production-related reasons, the aforementioned different components are then bonded "upside down" onto substrate 2 in this case. As a result, a bonding layer 10 forms. In this case, the greatly increased heat dissipation via highly thermally conductive substrate 2 compensates for the increased thermal resistance of bonding layer 10. In addition, the compact design permits very small inductances in the laser circuits, in order to achieve preferably short pulse times and high efficiencies.

Due to the already fanned-out heat dissipation of laser diodes 3, base substrate 9 can also be made of a poorer thermally conductive material, since the necessary temperature distribution away from laser diodes 3 is already achieved using substrate 2. PCB, $Al_2O_3$, glass, or also AlN, among others, can be utilized as base substrate 9. The closer the thermal expansion coefficients of substrate 2 and base substrate 9 are selected to be, the lesser the tendency is that the structure formed from substrate 2 and base substrate 9 will undergo a thermal deformation.

It is also conceivable that electrically conductive compensation structures 6 are replaced by solder balls or deposits in the case of appropriately low laser diodes 3 (<250 μm). These then no longer require an appropriate bonding layer 10 on base substrate 9.

Finally, substrate 2 can be made of silicon. Substrate 2 can contain cavities (not represented) having appropriate metallization at the positions of laser diodes 3. These cavities accommodate laser diodes 3 with a micromechanically precisely adjusted height tolerance and, in this way, result in an extremely flat build-up technique, which can be integrated with known integration technologies, such as flip chip or Cu pillars, on base substrate 9.

Cavities can also, alternatively, be contained in a substrate 2 made of ceramic.

Laser diode device 1 manufactured and built up in this way encompasses precisely oriented laser diodes 3, which, having been function-tested, can be integrated onto a cost-effective base substrate 9 along with the rest of the circuitry.

What is claimed is:

1. A laser diode device comprising:
   a thermally conductive first substrate that includes a planar surface by which ambient heat can be dissipated; and
   a plurality of laser diodes situated on the first substrate; wherein:
   each of the plurality of laser diodes includes at least one epitaxial layer;
   an electrically conductive coating that is situated between the at least one epitaxial layer and the first substrate is configured to electrically activate the respective laser diode; and
   the first substrate includes a plurality of metallized areas at which the plurality of laser diodes are accommodated such that the plurality of laser diodes have an essentially uniform height above the first substrate; and
   wherein:
   (I) for each respective one of the plurality laser diodes, a respective base surface of the respective laser diode that is supported on the first substrate extends parallel to a direction in which the planar surface extends;
   (II) the plurality of laser diodes are fastened to a second substrate via their respective sides facing away from the first substrate; and/or
   (III) the laser diode device further comprises, for each of at least one pair of immediately adjacent ones of the plurality of laser diodes:
   (i) a respective electrically conductive compensation structure situated on the first substrate between the laser diodes of the respective pair;
   (ii) a respective electrically conductive compensation structure that (a) is situated on the first substrate between the laser diodes of the respective pair, and (b) has a same height as the laser diodes of the respective pair; and/or
   (iii) a respective capacitor situated on the first substrate between the laser diodes of the respective pair.

2. The laser diode device of claim 1, wherein the laser diode device comprises, for the each of the at least one pair of immediately adjacent ones of the plurality of laser diodes, the respective electrically conductive compensation structure situated on the first substrate between the laser diodes of the respective pair.

3. The laser diode device of claim 2, further comprising solder or a conductive adhesive by which the electrically conductive compensation structure is fastened on the first substrate.

4. The laser diode device of claim 2, wherein the plurality of laser diodes and the electrically conductive compensation structure are fastened to the second substrate via their respective sides facing away from the first substrate.

5. The laser diode device of claim 4, wherein a thermally conductive bonding layer by which the plurality of laser diodes and the electrically conductive compensation structure are fastened to the second substrate compensates for height differences between the plurality of laser diodes and the electrically conductive compensation structure.

6. The laser diode device of claim 2, wherein the metallized areas each includes a respective cavity that is metallized and in which a respective one of the laser diodes is arranged.

7. The laser diode device of claim 1, wherein the laser diode device comprises, for the each of the at least one pair of immediately adjacent ones of the plurality of laser diodes, the respective electrically conductive compensation structure that (a) is situated on the first substrate between the laser diodes of the respective pair, and (b) has the same height as the laser diodes of the respective pair.

8. The laser diode device of claim 7, wherein the metallized areas each includes a respective cavity that is metallized and in which a respective one of the laser diodes is arranged.

9. The laser diode device of claim 1, wherein the laser diode device comprises, for the each of the at least one pair of immediately adjacent ones of the plurality of laser diodes, the respective capacitor situated on the first substrate between the laser diodes of the respective pair.

10. The laser diode device of claim 9, wherein the plurality of laser diodes and the capacitor are fastened to the second substrate via their respective sides facing away from the first substrate.

11. The laser diode device of claim 10, wherein a thermally conductive bonding layer by which the plurality of laser diodes and the capacitor are fastened to the second substrate compensates for height differences between the plurality of laser diodes and the capacitor.

12. The laser diode device of claim 9, wherein, for the each of the at least one pair of immediately adjacent ones of the plurality of laser diodes, the respective capacitor has the same height as the laser diodes of the respective pair.

13. The laser diode device of claim 9, wherein the metallized areas each includes a respective cavity that is metallized and in which a respective one of the laser diodes is arranged.

14. The laser diode device of claim 1, wherein the plurality of laser diodes are fastened to the second substrate via their respective sides facing away from the first substrate.

15. The laser diode device of claim 14, wherein a thermally conductive bonding layer by which the plurality of laser diodes are fastened to the second substrate compensates for height differences between the plurality of laser diodes.

16. The laser diode device of claim 14, wherein the metallized areas each includes a respective cavity that is metallized and in which a respective one of the laser diodes is arranged.

17. The laser diode device of claim 1, for the each respective one of the plurality laser diodes, the respective base surface of the respective laser diode that is supported on the first substrate extends parallel to the direction in which the planar surface extends.

18. The laser diode device of claim 17, wherein the metallized areas each includes a respective cavity that is metallized and in which a respective one of the laser diodes is arranged.

* * * * *